United States Patent
Hakemeyer et al.

(10) Patent No.: US 8,975,543 B2
(45) Date of Patent: Mar. 10, 2015

(54) ELECTRICAL TERMINAL MODULE

(75) Inventors: Frank Hakemeyer, Horn-Bad Meinberg (DE); Christian Starke, Lemgo (DE); Juergen Kleinschmidt, Detmold (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 935 days.

(21) Appl. No.: 13/129,173

(22) PCT Filed: Nov. 17, 2009

(86) PCT No.: PCT/EP2009/008182
§ 371 (c)(1),
(2), (4) Date: May 13, 2011

(87) PCT Pub. No.: WO2010/054854
PCT Pub. Date: May 20, 2010

(65) Prior Publication Data
US 2011/0211355 A1    Sep. 1, 2011

(30) Foreign Application Priority Data
Nov. 17, 2008   (DE) .......................... 10 2008 057 748

(51) Int. Cl.
*H01H 19/00* (2006.01)
*H01H 21/00* (2006.01)
*H03J 1/06* (2006.01)
(Continued)

(52) U.S. Cl.
CPC . *H03J 1/06* (2013.01); *G04C 23/46* (2013.01); *H01H 19/001* (2013.01); *H01H 19/025* (2013.01); *H01H 19/03* (2013.01); *H01H 19/585* (2013.01)

USPC ...................................................... 200/11 TW (58) Field of Classification Search
CPC ......... H01H 19/00; H01H 21/00; H01H 9/00; H01H 19/11; H01H 19/58; H01H 67/26; H01H 3/08; H01H 19/14
USPC ........... 200/11 TW, 316, 11 R, 308–317, 179, 200/11 G, 6 BB, 19.07, 19.18, 336
See application file for complete search history.

(56) References Cited

U.S. PATENT DOCUMENTS 3,621,162 A * 11/1971 Wall ........................... 200/61.39
4,131,771 A * 12/1978 Erickson et al. .......... 200/11 DA
(Continued)

FOREIGN PATENT DOCUMENTS

AT           212427 B      12/1960
DE          1921230 A1     2/1971
(Continued)

*Primary Examiner* — Edwin A. Leon
*Assistant Examiner* — Anthony R. Jimenez
(74) *Attorney, Agent, or Firm* — Leydig, Voit & Mayer, Ltd.

(57) ABSTRACT

An electric terminal module includes a plurality of electric contact elements configured to connect to electric conductors and a housing including an opening in at least one side wall thereof. A printed circuit board is disposed in the housing. The printed circuit board includes a circuit arrangement having a plurality of electric components configured to perform a specific function and a mount. An adjusting device is operable to change at least one electric characteristic quantity of the circuit arrangement. The adjusting device is mounted directly onto the printed circuit board on the mount and is operable from outside the housing through the opening so as to swivel or turn.

18 Claims, 9 Drawing Sheets

(51) Int. Cl.
*G04C 23/46* (2006.01)
*H01H 19/02* (2006.01)
*H01H 19/03* (2006.01)
*H01H 19/58* (2006.01)

(56) References Cited

U.S. PATENT DOCUMENTS

| | | | |
|---|---|---|---|
| 4,190,749 A * | 2/1980 | Erickson et al. | 200/11 TW |
| 4,395,610 A | 7/1983 | Downs | |
| 5,570,777 A | 11/1996 | Skarivoda | |
| 5,927,486 A | 7/1999 | Kamiya | |
| 6,236,002 B1 * | 5/2001 | Chou | 200/4 |
| 7,223,926 B1 * | 5/2007 | Gannon et al. | 200/11 R |
| 7,728,240 B2 * | 6/2010 | Dodal et al. | 200/252 |
| 2006/0082558 A1 | 4/2006 | Chen et al. | |

FOREIGN PATENT DOCUMENTS

| | | |
|---|---|---|
| DE | 2521789 A1 | 11/1976 |
| DE | 2928558 A1 | 1/1981 |
| DE | 4308242 C1 | 4/1995 |
| DE | 19807912 A1 | 8/1998 |

* cited by examiner

ELECTRICAL TERMINAL MODULE

CROSS REFERENCE TO RELATED APPLICATIONS

This application is a U.S. National Phase application under 35 U.S.C. §371 of International Application No. PCT/EP2009/008182, filed on Nov. 17, 2009, and claims benefit to German Patent Application No. DE 10 2008 057 748.0, filed on Nov. 17, 2008. The International Application was published in German on May 20, 2010 as WO 2010/054854 A1 under PCT Article 21 (2).

FIELD

The invention relates to an electric terminal module having an adjusting device for changing at least one electric characteristic quantity of a circuit arrangement on a printed circuit board in the module.

BACKGROUND

Electric terminal modules of the generic type, along with additional electric and/or electronic terminal modules, are installed primarily in switching cabinets. The electric terminal modules are normally attached in the switching cabinet by latching them onto a top-hat rail, whereby they are preferably arranged directly next to each other. In order to cut costs, the operators of machinery and installations strive to utilize the available switching cabinet space as efficiently as possible and—to the greatest extent possible—to reduce the number of switching cabinets that have to be set up.

The manufacturers of electric terminal modules are paying heed to this trend and more and more often, they are providing the operators of machinery and installations with electric terminal modules that are increasingly narrow so that an ever-greater number of them can be installed in a switching cabinet. Thus, terminal modules with an overall width of less than 8 mm are already available on the market. The reduction of the overall width of the electric terminal modules means that the space available for the installation of populated printed circuit boards is also continuing to decrease. In an electric terminal module with an overall width of less than 8 mm, not only the thickness of a printed circuit board that is installed in the electric terminal module but also the overall height of the electronic components installed on the printed circuit board are likewise gaining ever-greater importance.

Many of the above-mentioned electric terminal modules offer users the possibility to select settings from outside of the housing, so that they can set or change an electric functions of the terminal module such as, for example, a time function. Thus, such electric terminal modules make it possible to set the time after which, for example, a switching operation should be actuated in an application. The term adjustment of a function of the electric terminal module should also be understood to mean the setting and/or adjusting of an electric and/or physical parameter of the function of the electric terminal module. Other electric functions and/or parameters that can be set include, for example, current values, voltage values, resistance values, value ranges of input and/or output variables, amplification factors, delay times, modes of operation and the like. Particularly in the case of safety-related applications, the electric terminal modules of the generic type provide safety-relevant functions such as, for example, the setting of a maximally permissible speed for a safely reduced speed of a motor that is connected to the electric terminal module. Moreover, the other functions can also include the setting of frequencies of signals that have to be emitted, the single-channel or multiple-channel processing of input signals connected to the electric terminal module, the selection of muting functions and/or protection ranges, the setting of safe modes of operation or other safety-related functions.

It is often the case that adjustable potentiometers, capacitors, inductors, operating mode switches or the like are used to change the function of an electric terminal module. However, components are also used in which the function of the electric terminal module is set contact-free, for instance, through the optical and/or inductive detection of the adjustment path or through the detection of a momentary relative and/or absolute position of the adjusting means. Such components are normally arranged on the assembled side of a printed circuit board.

The adjusting means themselves are, for the most part, configured as mechanical switches, dials, levers, pushbuttons or the like. Consequently, the adjusting means can be not only turned but also swiveled or switched.

Due to the limited installation space available in electric terminal modules of the generic type, primarily electrical components employing SMD technology are used, which are installed and soldered directly onto the printed circuit board without connection wires. Since such components are arranged on at least one side of a printed circuit board, they are adjusted perpendicular to the surface of the printed circuit board.

In electric terminal modules with an overall width of less than 8 mm, preferably less than or equal to 6.2 mm, an opening can be provided in one side of the terminal modules in order to adjust the components that are installed on the printed circuit board. The electrically adjustable components are adjusted by inserting a screwdriver through the opening that has been created in the side surface of the electric terminal module as well as into an opening that is provided in the electric component for adjusting its electric characteristic quantity and that is configured to receive, for example, the tip of a screwdriver. In the described arrangement of the adjustable electric component, the adjustment is only possible from one side of the terminal module. However, as a rule, an adjustment is no longer possible once several electric terminal modules are arranged directly next to each other.

Another solution is to provide a printed circuit board underneath a cover of an electric terminal module, whereby the adjustable electric component is arranged on said printed circuit board. In this case, the component is adjusted using a screwdriver through an opening that passes through the cover. However, such a configuration is not possible if there is no longer sufficient space available for the component and for the additional printed circuit board in the housing due to the limited overall width of the electric terminal module. In the case of overall widths of less than 8 mm, such a solution is no longer feasible. Moreover, in order to assemble such a terminal module, there is a need for an additional printed circuit board and for another work step in order to populate the terminal module. Both of these measures result in an undesired increase in the production costs.

Furthermore, it should be pointed out that the soldering points of the electric components employing SMD technology are hardly capable of adequately absorbing the forces that occur, for example, when a screwdriver is used to carry out the adjustment. Thus, it can easily happen that the components are over-twisted or are even broken away from the printed circuit board.

Therefore, in view of the small overall width of the electric terminal modules, it is most advantageous to arrange the adjustable electric components on the printed circuit board that is installed in the electric terminal module and to also permit an adjustment when several electric terminal modules are arranged next to each other when they are installed, especially on a top-hat rail.

Sometimes, a wheel can be installed on the adjustable electric components in such a way that the rim of the wheel extends partially over the front of the electric terminal module and can be operated from the outside. The component is positioned near the edge of a printed circuit board.

However, it is a drawback that the above-mentioned electric components such as potentiometers, adjustable capacitors and the like are structured as compact components that are closed towards the outside and that have soldering tags or connection legs on the outside for purposes of soldering such components onto a printed circuit board. Furthermore, such components are made up of numerous individual elements that are arranged on top of each other in several layers and that are installed together in a specially provided housing.

SMD components are normally attached to a printed circuit board by soldering at least one edge of the component housing to contact points on the printed circuit board. Consequently, as far as the available overall width is concerned, it is necessary to take into account not only the thickness of the printed circuit board but also the overall height of the electric component.

Conventional potentiometers, for example, are structured in such a way that resistance layers and at least one pick-off track are arranged on a carrier material, and a pick-up that creates an electric connection between both of them accesses said pick-off track. The entire arrangement is installed in its own housing. With this type of potentiometer, a wheel is additionally installed on the component and this wheel can be used, for example, to adjust the resistance value of a potentiometer. The same applies in an analogous manner for other adjustable electric components such as, for instance, adjustable capacitors such like variable capacitors and/or trimmers, adjustable inductors or else for adjustable electric components in which the change in the position of the wheel is determined optically, inductively and/or capacitively.

Moreover, by arranging a wheel on the adjustable electric component at a later point in time, the connecting points on the printed circuit board are covered, so that it is hardly or not at all possible to check the quality of the soldering points. This makes the search for flaws very difficult in case of flawed soldering points. Moreover, when the potentiometer with an attached wheel is soldered, the temperature is so high that the wheel, which is normally made of plastic, would be damaged. Since the overall height of such a potentiometer is already considerable, there would not be much space left for the rim of the wheel, thus making it difficult to adjust the wheel. Moreover, the rim can no longer be printed on.

All of the above-mentioned electric components themselves already have an overall height that—with the installation of a wheel and with the thickness of the printed circuit board—sometimes considerably exceeds the space available in electric terminal modules having an overall width of well below eight millimeters.

German patent application DE 1921230 A describes a potentiometer in which several resistance layers are installed on an insulating plate. A wiper is attached onto a shaft, and this shaft is mounted rotatably in a collar which, in turn, is secured in a bore of the insulating plate. The adjustment of the resistance value of the potentiometer is carried out by adjusting the shaft onto which a wiper is attached and whose end has a slit to receive the tip of a screwdriver. In addition, there are at least two washers that, together with the thickness of the insulating plate, further increase the overall height of the potentiometer. No additional electric components are arranged on the insulating plate. The described potentiometer is connected to additional components on a printed circuit board via soldering tags with mounting holes and/or soldering holes, so that the forces that occur when the potentiometer is adjusted have to be dissipated onto the printed circuit board exclusively through the soldering tags.

German patent application DE 2521789 A1 describes a potentiometer or slide resistor that is preferably provided as an individual building block for purposes of creating a direct, integral connection to a printed circuit board that has additional switching elements. For this purpose, resistance layers are applied onto the surface of the printed circuit board and these resistance layers are accessed by a pick-off that connects a pick-off track to resistance sliding tracks. The resistance value of the potentiometer can be changed by sliding the pick-off. Since the printed circuit board is perforated, a mounting part and a sliding or holding part are provided for guiding and attaching the component onto and/or into the circuit substrate. These parts are arranged on both sides of the perforated printed circuit board. The mounting part and the sliding or holding part on both sides of the surface of the printed circuit board increase the overall height of the potentiometer to such an extent that installation into electric terminal modules of the generic type is no longer possible.

An electric terminal module that already contains a printed circuit board with an adjustable electric component is described in German patent specification DE 43 08 242 C1. The adjustable electric component on the circuit substrate, the printed circuit board with the appertaining circuitry, the thumbwheel provided for adjusting the adjustable electric component arranged on the circuit substrate, and the appertaining covers are connected to each other before being installed and they are subsequently placed into the housing. In this approach as well, the overall height of the thumbwheel that is connected to the adjustable electric component also still has to be added to the overall height of the adjustable electric component. Its use in an electric terminal module with an even narrower overall width of less than eight millimeters is likewise no longer possible.

SUMMARY

In an embodiment, the present invention provides an electric terminal module including a plurality of electric contact elements configured to connect to electric conductors and a housing including an opening in at least one side wall thereof. A printed circuit board is disposed in the housing. The printed circuit board includes a mount and a circuit arrangement having a plurality of electric components configured to perform a specific function. An adjusting device is operable to change at least one electric characteristic quantity of the circuit arrangement. The adjusting device is disposed directly onto the printed circuit board via the mount and is operable from outside the housing through the opening so as to swivel or turn.

BRIEF DESCRIPTION OF THE DRAWINGS

Exemplary embodiments of the present invention are described in more detail below with reference to the drawings, in which.

DETAILED DESCRIPTION

An aspect of the present invention is to provide an electric terminal module whose predetermined function can be changed, whereby even narrower housing widths make it possible to achieve a convenient operation while avoiding the drawbacks of the state of the art.

According to an embodiment of the invention, he an adjusting device is mounted on a mount directly onto the printed circuit board.

Since the adjusting device, or adjusting means is mounted directly onto the printed circuit board, the overall width of the electric terminal module can be greatly reduced. The overall width of the electric terminal module is only determined by the width of the adjusting means and by the thickness of the printed circuit board. The forces that occur because of an adjustment of the adjusting means are dissipated directly to the printed circuit board and are not absorbed by the connecting points of the electric component, thus achieving a sturdier attachment of the electric component onto the printed circuit board.

An embodiment of the electric terminal module according to the invention provides that the adjusting means is mounted by riveting and/or latching the adjusting means in the mount on the printed circuit board.

In this manner, it is advantageously achieved that, in order to attach the adjusting means, there is no need for additional holding and/or mounting means that would have to be added to the overall height of the adjustable electric component. Furthermore, the forces that occur when the adjusting means is adjusted are dissipated directly to the printed circuit board, and they do not have to be absorbed by soldered connections or the like. Consequently, the electric component is largely prevented from being inadvertently pulled off.

Due to the narrow design of the electric terminal module, in addition or as an alternative, a housing part can be arranged on the inside of the housing opposite from the adjusting means, said housing part being shaped onto the inside of the housing in such a way that it accommodates the adjusting means in-between. The forces that occur during the adjustment are additionally dissipated by the housing part to the housing, thereby achieving an even greater stability of the adjusting means on the printed circuit board.

In an embodiment of the electric terminal module according to the invention, means are provided on the printed circuit board in order to support the adjusting means on the printed circuit board.

Via the additional support on the rim of the adjusting means, the forces that occur during the adjustment of the adjusting means are even more effectively dissipated to the printed circuit board and this translates into an even greater mechanical stability.

In an embodiment, it is also provided that the means for supporting the adjusting means on the printed circuit board are formed by a sliding track that is arranged on the printed circuit board and whose geometry corresponds at least partially to the geometry of the adjusting means.

The arrangement of the sliding track on the printed circuit board corresponding to the geometry of the adjusting means achieves, on the one hand, that the forces that occur during the adjustment are additionally dissipated to the printed circuit board. On the other hand, the sliding track prevents the friction that occurs on the surface of the printed circuit board during the adjustment from damaging the printed circuit board. Moreover, the additional sliding track can also be used as a series resistor for electric components such as, for example, diodes, or as a resistor within the circuit arrangement.

In an embodiment of the invention, it is provided that, on the surface of the adjusting means facing the surface of the printed circuit board, elements are provided that interact with counter-elements arranged on and/or in the printed circuit board in such a way that an electric characteristic quantity is formed between them when a voltage is applied.

Since the adjustable electric component is formed by elements and counter-elements that interact with each other, whereby one element is arranged on a surface of the adjusting means, and the counter-element is arranged on or in the printed circuit board, this gives rise to an adjustable electric component. The direct mounting of the adjusting means in the mount on the printed circuit board translates into a compact, space-saving structure of the adjustable electric component so that the overall height of the adjustable electric component thus formed is essentially determined only by the width of the adjusting means itself. The overall height of the adjustable electric component has thus been reduced to such an extent that it can also be used in electric terminal modules with a "narrow design" having an overall width of less than eight millimeters.

Another embodiment of the invention provides that the characteristic quantity formed between the elements of the adjusting means and the counter-elements on and/or in the printed circuit board is an electric resistance, a capacitance and/or an inductance.

In this manner, a small overall height of the adjustable electric component is achieved, as a result of which its use is possible with other electric components arranged on the circuit arrangement in electric terminal modules having an overall width of less than eight millimeters. It is especially advantageous for the employed elements and counter-elements to be arranged essentially between the surface of the printed circuit board and the surface of the adjusting means located opposite from the printed circuit board. The rim of the adjusting means can encompass the entire adjustable electric component and thus shield it from environmental influences.

The same advantage is attained when the elements and counter-elements are arranged in such a way that different current paths can be set and the relative and/or absolute position of the adjusting means on the printed circuit board can be detected optically, capacitively and/or inductively. In addition, the contact-free detection of the position of the adjusting means avoids the wear and tear and/or abrasion of the elements and counter-elements of the adjustable electric component.

Due to the structure of the adjustable electric component with elements that are arranged on the adjusting means as well as on the printed circuit board, the overall dimensions of the electric component are reduced to such an extent that the electric components can be used with the printed circuit board in electric terminal modules having a "narrow design" with an overall width of less than eight millimeters, a process in which a simple, convenient adjustability of the function of the electric terminal module is retained.

Preferably, it is also provided that additional elements are arranged between the edge of the adjusting means facing the printed circuit board and, corresponding thereto, on the printed circuit board, said elements interacting in such a way that a second electric characteristic quantity is formed between them when a voltage is applied.

The arrangement of additional elements such as printed conductors, pick-ups or the like on the edge of the side of the adjusting means facing the surface of the printed circuit board and, corresponding thereto, the arrangement of additional counter-elements on the surface of the printed circuit board entails the advantage that a second electric characteristic quantity can be formed with the same arrangement of adjusting means and printed circuit board.

Another embodiment of the invention provides that latching means of the adjusting means are arranged on and/or in the printed circuit board at predetermined intervals.

Thanks to the latching means, it is achieved that predefined setting positions are offered to an operator for the setting of the electric characteristic quantity, and these setting positions allow a more precise setting of predefined intermediate values of the electric characteristic quantity.

Moreover, it is provided that the adjusting means consists of a transparent and/or translucent material, and that means for illuminating the adjusting means are provided on and/or in the printed circuit board.

Since the electric terminal modules can be used inside as well as outside of switching cabinets and since the markings might be hard or impossible to read because of poor lighting conditions and/or in darkness, the use of a transparent and/or translucent material for the adjusting means and the arrangement of illuminating means below or next to the adjusting means makes it easy to read the set value or the set position of the adjusting means inside the electric terminal module. It is even easier to read the values if the color of the markings and the color of the material of the adjusting means contrast strongly to each other, for example, when a white, translucent plastic is used for the adjusting means and a black color for the markings.

Another embodiment provides that the adjusting means is preferably configured as a wheel on whose outer circumference markings are provided that allow the setting of the electric characteristic quantity in prescribed increments, whereby the markings can have a logical relationship with the specific electric characteristic quantity that has been set by the adjusting means.

Thanks to the markings, it is achieved that predefined values such as, for example, a switching time delay of five seconds or a current of five milliamperes that is to be output, can be set simply and intuitively by turning the appropriate marking, e.g. in the form of the number five, into the opening of the housing. Thus, in a simple manner, it is possible to set a specific value indicated in the form of a marking such as, for instance, a switch-off time of five seconds after which the electric terminal module is supposed to perform a corresponding switching operation. On the basis of the set marking, the operator receives information about the actually set physical value and, as a result, can more easily and intuitively set it and read it from outside of the electric terminal module. The logical relationship consists of providing the markings in such a way that they correspond to electric and/or physical values of the function of the electric terminal module that are to be set, and/or in such a way that they are easy to associate. If latching means are additionally provided, then a much easier, convenient and accurate setting of the electric characteristic quantity of the adjustable electric component and thus of the function of the electric terminal module is possible.

Another embodiment provides that stops are arranged on the printed circuit board for defining a starting and/or ending position of the adjusting means.

In this manner, over-turning of the adjusting means is prevented and the electric component is protected against mechanical damage. The operator receives clear feedback as to when a starting and/or ending position of the adjustable electric component has been reached.

The edge of the adjusting means can preferably completely surround the elements on the adjusting means as well as the counter-elements arranged on the printed circuit board.

Since the adjustable electric component is completely surrounded by the edge of the adjusting means, on the one hand, a compact structure is achieved and the component with its elements and counter-elements is shielded from harmful environmental influences. Moreover, the overall height of the adjusting means in the housing opening of the electric terminal module can be maximized, so that the surface for applying the markings on the rim of the adjusting means is increased and the operating convenience of the adjusting means in the electric terminal module is improved.

Moreover, it is preferably provided that the overall width of the housing is eight millimeters at the maximum and/or at most one and a half times greater than the height of the adjusting means.

Thanks to the direct mounting of the adjusting means in the mount on the printed circuit board, it is achieved that the printed circuit board can be installed together with the electric components in a housing whose overall width is less than eight millimeters, preferably less than or equal to 6.2 mm.

In electric terminal modules with an overall width, for instance, of only 6.2 mm, the overall height of the adjusting means is typically only about four millimeters. In adjustable electric components according to the state of the art onto which a setting wheel is merely clipped, the overall width would be well below four millimeters, so that especially the application of markings and/or a simple setting with such narrow electric terminal modules would no longer be possible.

In another embodiment, it is provided to arrange a second adjusting means on the side of the printed circuit board opposite from the adjusting means, as a result of which the advantage is achieved that, when more than one setting device is used, the space required for an additional printed circuit board is saved and the available installation space can be utilized even better. Since the oppositely arranged setting devices each hold part of the printed circuit board between them, several setting devices can be arranged on a single printed circuit board.

In an advantageous manner, it is also provided that the two adjusting means are mounted together by means of the mount on the two opposite sides of the printed circuit board. The better utilization of the installation space additionally achieves that the adjusting means can be operated jointly through an opening in at least one side wall of the housing at the same height through one and the same opening of the housing wall. If both adjusting means are coupled via the shared mount, then a simultaneous adjustment of several electric characteristic quantities of the circuit arrangement is possible.

It goes without saying that the above-mentioned features as well as the features that are going to be explained below can be used not only in the indicated combination but also in other combinations or on their own, without departing from the scope of the present invention.

Figure 1:
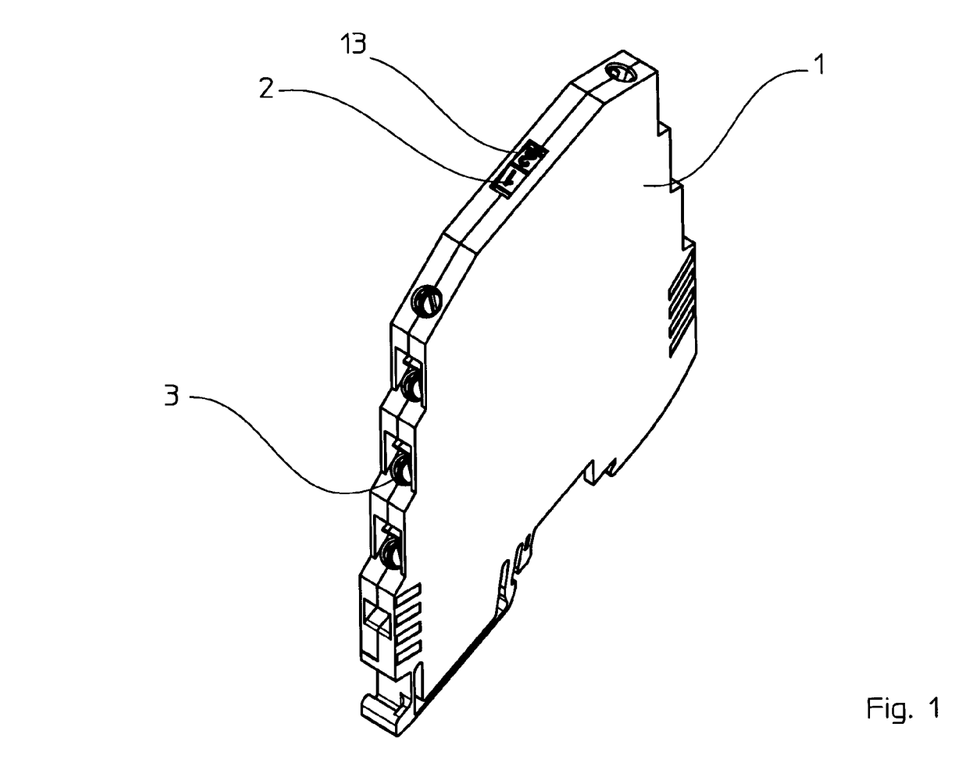
FIG. 1 shows an electric terminal module in a perspective view.

FIG. 1 shows a preferred embodiment of an electric terminal module of the type according to the invention. The housing has numerous contact elements 3 to which the electric lines can be connected. The electric lines establish connections to sensors, actuators and/or other electric terminal modules. The lines are attached to the electric terminal module by means of the generally known technique using screw-type terminals, spring-type terminals or the like.

The adjusting means 2 is arranged on the upper housing side and it can be used to set or change the function of the electric terminal module. For this purpose, the housing 1 is provided with a housing opening 13 through which the adjusting means 2 can be adjusted. In FIG. 1, the adjusting means 2 is configured as a dial and arranged directly on the printed circuit board 4.

Figure 2:
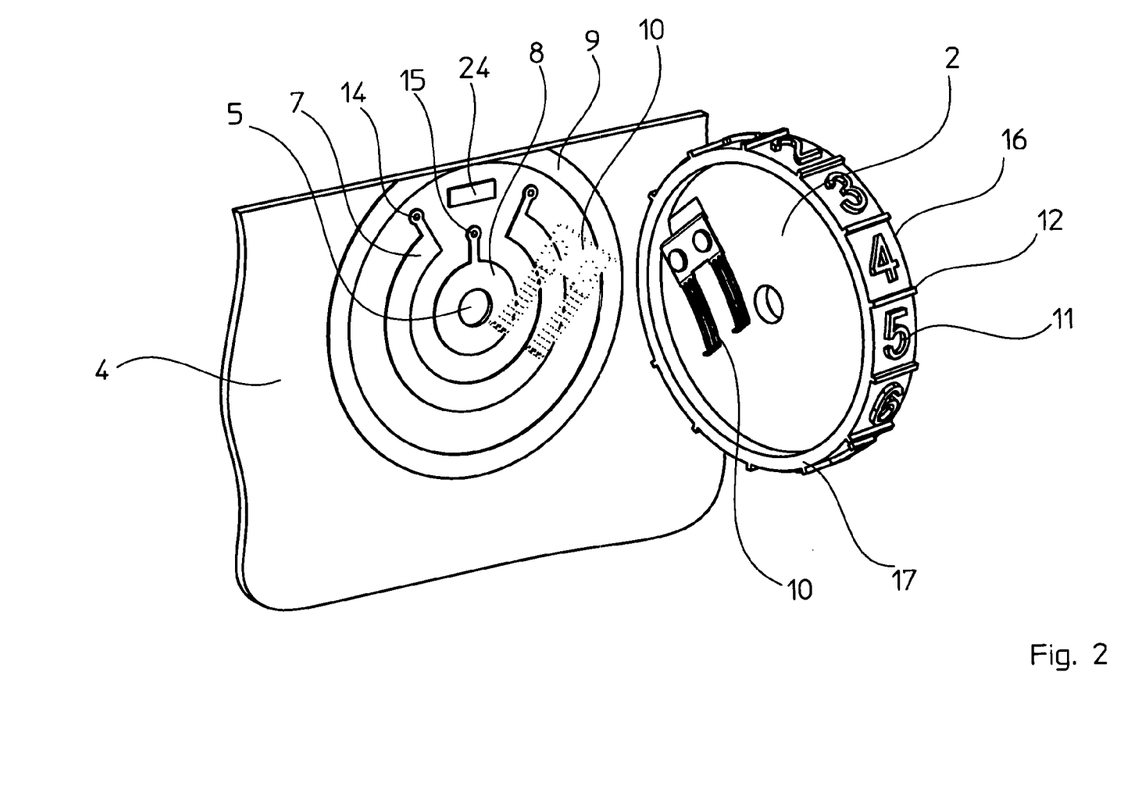
FIG. 2 shows an uninstalled adjustable electric component structured as a potentiometer with a pick-up installed on the adjusting means.

FIG. 2 shows the adjusting means in the state in which it has not yet been arranged on the printed circuit board. At least a first printed conductor section 7 in the form of a resistance sliding track and a second printed conductor section in the form of a pick-off track 8 are provided on the printed circuit board 4, and they are electrically connected to each other via a pick-up 10. The pick-up 10 is arranged on the surface of the adjusting means 2 that is opposite from the surface of the printed circuit board. The printed conductor section 7 provided in the form of a resistance sliding track can be created by applying a resistive layer, namely, the pick-off track, for example, by applying an electrically conductive layer directly onto the surface of the printed circuit board 4.

There are various possibilities for attaching the pick-up 10 on and/or in the adjusting means 2. Suitable options include, for example, attachment by means of a thermal process in which the pick-up 10 itself is also held by the plastic after a melting procedure. As an alternative, the pick-up can also be connected by adhesion techniques or by latching to the adjusting means 2. Fundamentally, all attachment methods are suitable that allow the pick-up 10 to be attached to the surface of the adjusting means 2, without this substantially increasing the overall height of the adjustable electric component.

The resistance sliding track 7 as well as the pick-off track 8 can be created in the generally known manner by applying a resistive and/or electrically conductive layer onto the surface of the printed circuit board.

By attaching the adjusting means 2 by a mount 5 on the printed circuit board 4, an adjustable electric component is created in which an electric characteristic quantity such as a resistance, a capacitance and/or an inductance is set in the circuit arrangement of the printed circuit board 4. This adjustable electric characteristic quantity can be used to set electrical and/or physical properties of a function of the electric terminal module.

The pick-up indicated with a dotted contour in FIG. 2 shows the position of the pick-up 10 when the adjusting means is arranged on the printed circuit board 4. One of the legs of the pick-up 10 is on the resistance sliding track 7 and its other leg is on the pick-off track 8. At least one of the ends of the resistance sliding track 7 is connected by a first connection point 14, and the pick-off track 8 is connected via a second connection point 15 to additional electric components of a circuit arrangement (not shown in FIG. 2). By applying a voltage to the electric terminal module, a current flows through the circuit arrangement, and it flows through the first connection point 14 via part of the resistance sliding track 7 to one leg of the pick-up 10, then further via the pick-up 10 to the pick-off track 8, and finally to the second connection point 15 back into the circuit arrangement, as a result of which an electric resistance of the adjustable electric component is established as the electric characteristic quantity between the first and second connection points 14, 15. The electric resistance can be changed by turning the adjusting means 2. If the pick-up 10 is adjusted in such a way that the current coming from the first connection point 14 has to flow through a longer section of the resistance sliding track 7, the resulting resistance of the adjustable electric component is greater, whereas if the section is smaller, the resulting resistance value decreases. Thus, the adjustable electric component shown in FIGS. 2 and 3 provides the function of a potentiometer that is connected via the connection points 14 and 15 to additional components in the circuit arrangement on the printed circuit board 4.

The electric characteristic quantity of the adjustable electric component can be used to set the physical properties of a function, for example, delay times and the like, that is carried out by the electric terminal module.

Figure 3:
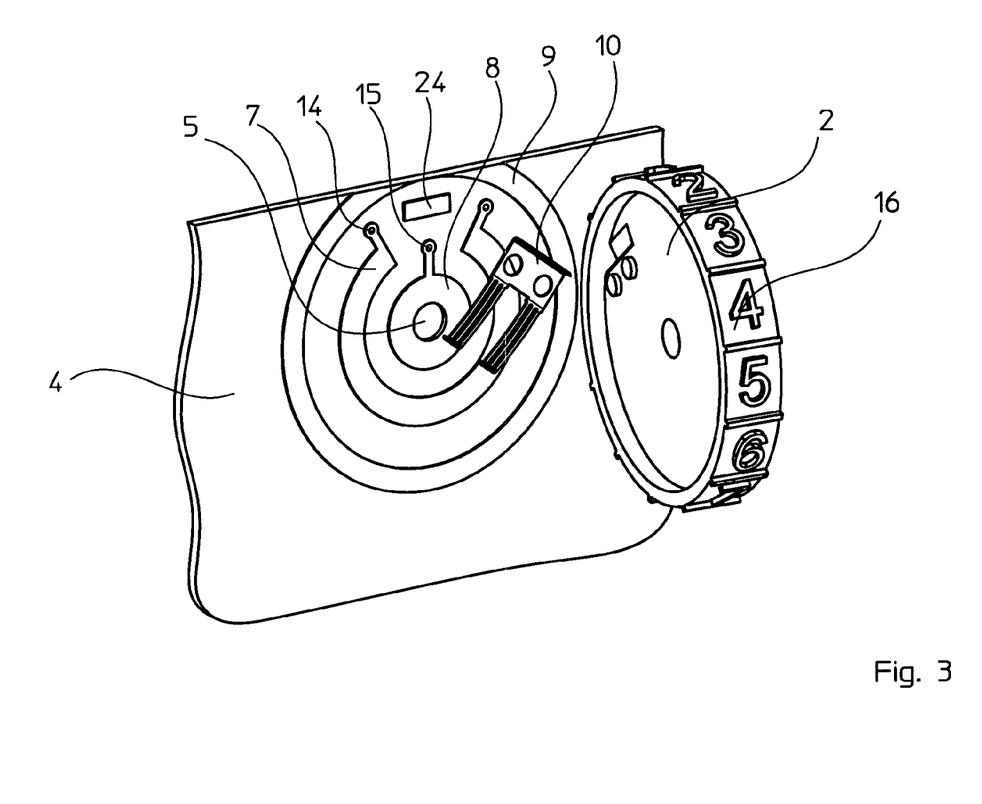
FIG. 3 shows an uninstalled adjustable electric component structured as a potentiometer with the pick-up installed on the printed circuit board.

For illustration purposes, FIG. 3 shows the positioning of the pick-up 10 on the resistance sliding track 7 and on the pick-off track 8 when, in the assembled state, the adjusting means 2 is arranged with the installed pick-up 10 on the printed circuit board 4.

Since the pick-up 10 is arranged inside the adjusting means 2, and since the resistance sliding track 7 and the pick-off track 8 are installed directly on the surface of the printed circuit board, a compact adjustable electric component is created. The overall height of the adjustable electric component is determined mainly by the width of its rim 16 of the adjusting means. The rim 16 of the adjusting means is considerably larger that the rim of the adjusting means known from the state of the art since the rim 16 of the adjusting means can utilize the entire space between the surface of the printed circuit board 4 and the opposite housing wall. As a result, it is wider, easier to print on, easier to read, and easier to adjust.

Figure 4:
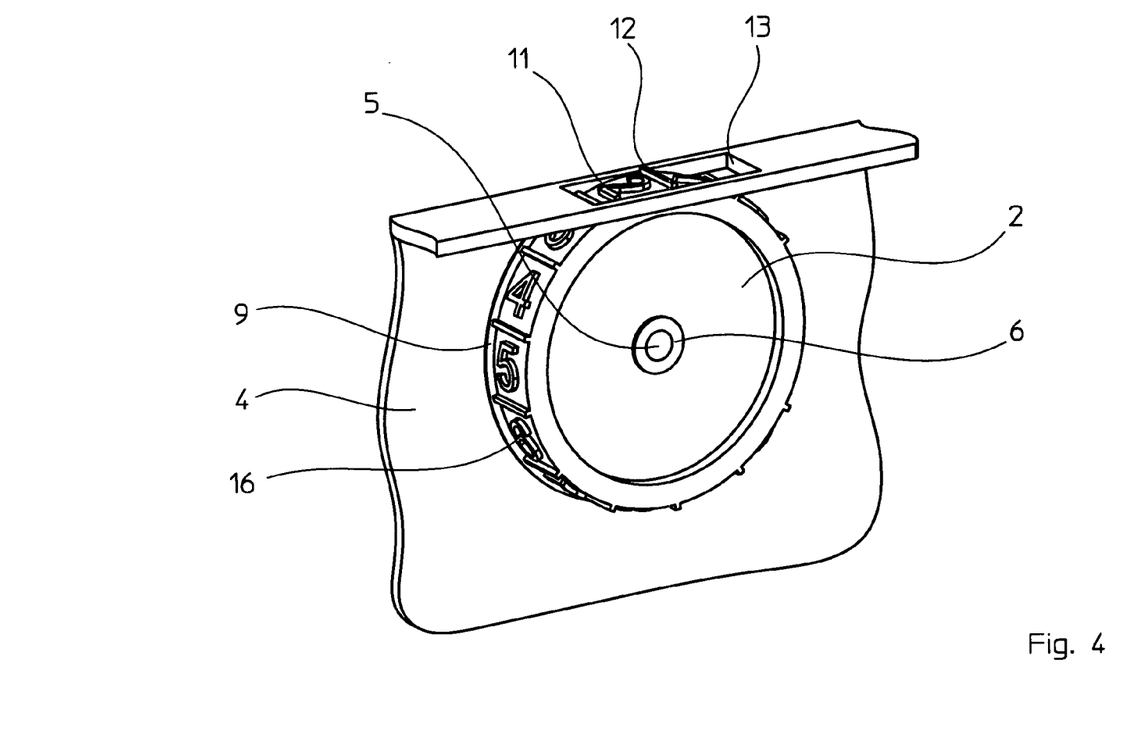
FIG. 4 shows a printed circuit board with an adjustable electronic component installed on the printed circuit board.

The adjusting means 2 is mounted directly on the printed circuit board 4 in the mount 5. In order to adjust the adjustable electric component, a force is exerted onto the rim 16 of the adjusting means and this force causes the rim 16 of the adjusting means to turn. The mount 5 of the adjusting means 2 dissipates the occurring forces to the printed circuit board 4. In FIG. 4, a rivet 6 is used to attach the adjusting means 2 to the printed circuit board 4. Due to the riveting of the adjusting means 2, no additional holding or mounting parts are needed, so that the overall height of the adjustable electric component is determined essentially only by the width of the rim 16 of the adjusting means and by the thickness of the printed circuit board. As an alternative, instead of a rivet 6, any other attachment modality can be used that allows the adjusting means 2 to be adjustable, as long as the total height of the adjustable electric component is not substantially enlarged by the fastening means. Thus, it is also fundamentally possible for the adjusting means 2 to be latched onto the printed circuit board 4.

The rivet 6 also allows the adjusting means 2 and the printed circuit board 4 to be electrically conductively connected to the electric circuit arrangement. Consequently, the rivet can also be connected to the second connection point 15 of the adjustable electric component.

The direct mounting of the adjusting means 2 in the mount 5 on the printed circuit board 4 dissipates the forces that occur during the adjustment of the adjusting means directly to the printed circuit board 4. For the installation in an electric terminal module with a "narrow design" having an overall width of less than eight millimeters, the gap between the edge 17 of the adjusting means and the printed circuit board 4 should be minimal so that the adjusting means 2 can be positioned as close as possible to the printed circuit board 4 so as to save even more space. The stability of adjusting means 2 and of the adjustable electric component can thus be further improved.

Due to the direct arrangement of the adjusting means 2 on the printed circuit board 4, there is a risk that the edge 17 of the adjusting means will rub against the printed circuit board and will damage the material of the printed circuit board 4 as an increasing number of adjustments are carried out. In order to prevent this, the printed circuit board 4 can be provided with a sliding track 9 on which the edge 17 of the adjusting means is supported so as to glide. The sliding track 9 can be formed by applying another electrically conductive and/or resistive layer onto the printed circuit board 4, whereby its geometry should correspond essentially to the geometry of the edge 17 of the adjusting means, but does not have to be present over the entire circumference of the adjusting means. It is sufficient if the sliding track 9 has at least two sections on the printed circuit board 4 for supporting the adjusting means 2. These sections can also be used, for example, as series resistors and/or as additional resistors in the circuit arrangement, or else as series resistors for the adjustable electric characteristic quantity.

In order to prevent the sliding track 9 from wearing down, the electrically conductive material of the sliding track 9 can have a higher glass content. The additional sliding track 9 reinforces the mounting of the adjusting means 2 in the mount 5 on the printed circuit board 4, and it also allows a more compact and sturdy construction of the adjustable electric component.

As shown in the figures, markings 11 are provided on the outer circumference of the adjusting means 2 and they allow the electric characteristic quantity to be set in predefined increments.

Elevations 12 that separate the individual markings from each other are arranged between the markings. The elevations 12 can also be configured as recesses in the material of the adjusting means 2. The markings 11 shown in the figures are configured as numerical symbols by way of example. As an alternative, it is also possible to use letters, dots, dashes or the like, or else a combination thereof. The numerical symbols can indicate, for example, predefined setting levels such as modes of operation or value ranges, and/or real physical values such as, for instance, five milliamperes, five seconds, five percent of the range final value or the like. If, for example, a current of five milliamperes or a switch-off time of five seconds is to be set, then the adjusting means 2 merely has to be turned until the number five appears in the opening of the housing 13. Therefore, the markings 11 can be arranged on the rim 16 of the adjusting means in such a way that they correspond to the value of the electric and/or physical function of the electric terminal module that is to be set, or else to a percentage of a range final value or the like. If the electric terminal module provides, for example, a time function in which a switching operation is to be actuated with a delay of five milliseconds, then an operator adjusts the adjusting means until the marking five appears in the housing opening 13.

The markings 11 can also symbolize a percentage pertaining to a rated range. Thus, for instance, the setting of the marking five can indicate that the momentarily set value is fifty percent of a defined range final value. If the value range of a function of the electric terminal module that is to be set extends from zero to twenty milliamperes, or from zero to three hundred seconds, then the positioning of the marking 5 in the opening 13 of the housing 1 would correspond to a value of ten milliamperes or one hundred and fifty seconds. Of course, this relationship can also be depicted by a line having half the length if the range final value is indicated by a line whose length is about the same as the width of the rim 16 of the adjusting means 2, and if the range initial value is indicated without a line or only with a dot.

The adjustable electric component arranged in the circuit arrangement then has to be dimensioned in such a way that a switching operation is triggered after the desired time, which is after five milliseconds in this example. The resistance value of the potentiometer that is set at the position five then interacts with the circuit arrangement on the printed circuit board 4 in such a way that a timing element with a delay time of five seconds is created. Of course, the adjustable electric component and the circuit arrangement created on the printed circuit board 4 with several electric and/or electronic components can be used to set additional physical variables and/or parameters of the function that is provided by the electric terminal module.

The precision of the setting can be defined by the number of markings 11 on the rim 16 of the adjusting means and by their distances with respect to each other. Furthermore, the precision of the setting is also dependent on the radius of the adjusting means 2. The more markings 11 and/or recesses or elevations 12 are provided and/or the larger the radius of the adjusting means 2 is, the more precise and/or fine the setting of the electric characteristic quantity of the electric component can be. Consequently, the setting precision of typically five percent seen in the generic electric terminal modules known from the state of the art can be increased to a value of less than or equal to 2.5 percent of the range final value.

FIG. 4 shows the arrangement of the adjusting means 2 on the printed circuit board 4 when the adjusting means 2 is arranged on the printed circuit board by means of riveting. Part of the rim 16 of the adjusting means 2 can project out of the housing opening 13 of the electric terminal module or else can be arranged below it. If the rim 16 of the adjusting means does not project out of the opening 13 of the housing of the electric terminal module, then, for example, a transparent seal can be placed to secure against unintentional adjustments and/or harmful environmental influences. In this manner, the opening 13 is sealed or the housing 1 is closed off in such a way that the inside of the electric terminal module is shielded from environmental influences. The adjustment of the adjusting means 2 is carried out by turning the adjusting means 2 on its rim 16. The depicted elevation 13 that, as an alternative can be configured as a notch-shaped recess, allows a simpler and more precise adjustment of the adjusting means 2. Due to the small width of the rim of the adjusting means, better adjustability can be achieved with a narrower screwdriver whose tip can engage on the elevation 12 or in a corresponding notch-shaped recess.

The slight width of the rim 16 of the adjusting means or an installation of the electric terminal module at an inadequately illuminated installation site can make the reading of the markings more difficult. In this case, the adjusting means 2 can be made of a transparent and/or translucent material. Preferably, in order to improve the readability, the illuminating means 24 is arranged on the printed circuit board 4 below the adjusting means 2 near the housing opening 13. However, the illuminating means 24 can also be arranged on the side of the adjusting means 2 opposite from the housing opening 13 or else next to it.

Aside from illuminating the adjusting means 2, the illuminating means 24 can also provide diagnostic information about the state of the electric terminal module or whether a range has been exceeded, it can display switching operations and indicate positive or negative results of a performed self-test and the like. Thus, for example, errors in the electric terminal module can be indicated by different blinking frequencies, intensities and/or colors. In the simplest case, the illuminating means 24 can display an applied operating voltage and/or the operational readiness of the electric terminal module.

Figure 5:
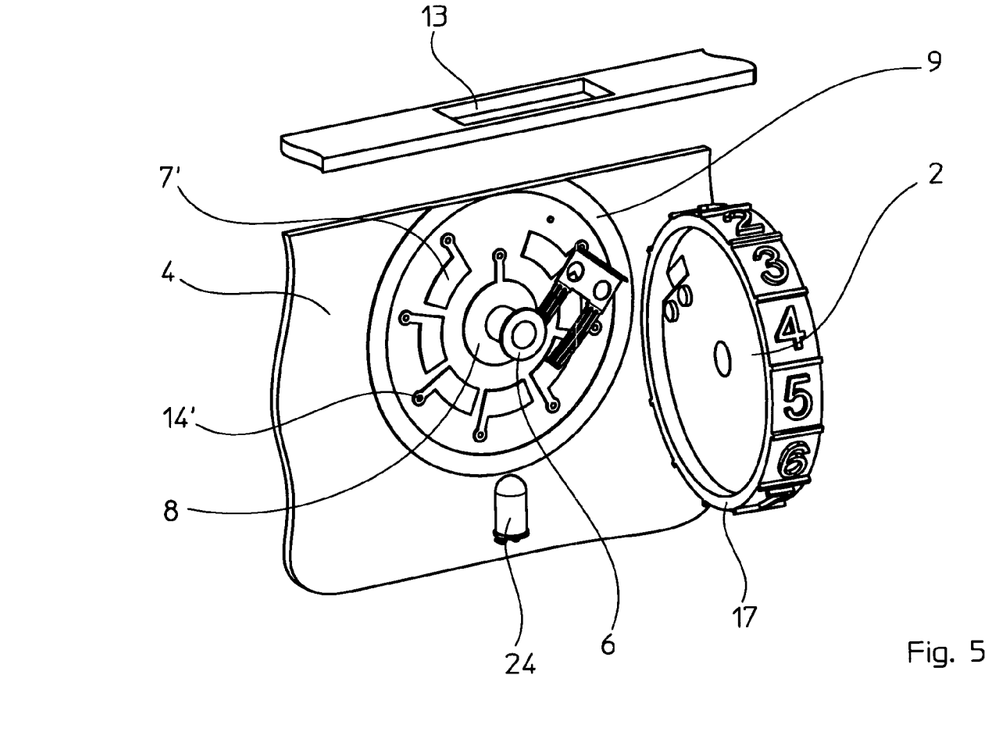
FIG. 5 shows an adjustable electric component configured as a switch in the electric terminal module.

FIG. 5 shows the realization of a switching function using the adjusting means 2 of the pick-up 10, a first printed conductor section 7' interrupted by non-conductive sections, and a second printed conductor section in the form of a pick-off track 8. One leg of the pick-up 10 is connected to the pick-off track 8 in the installed state, whereas, when the adjusting means 2 is turned, the other leg wipes alternately over conductive and non-conductive sections of the first printed conductor section 7'. The conductive sections of the first printed conductor section 7' are connected to the components of the circuit arrangement arranged on the printed circuit board 4 via first connection points 14', while the pick-off track 8 is connected thereto via a second connection point 15.

An electrically conductive printed circuit board and/or a resistive layer can be used for the first printed conductor section 7'.

An electric current can only flow if both legs of the pick-up are over conductive material. The current then flows from the circuit arrangement via a first connection point 14', via the at least one conductive section of the first printed conductor section 7', further via the pick-up 10 to the pick-off track 8 and to the circuit arrangement via the second connection point 15. Owing to this embodiment of the adjustable electric component, a switching function, for example, for selecting a predefined mode of operation of the electric terminal module, can be selected. The number of switching positions made available by the adjustable electric component depends on the number of conductive sections of the first printed conductor section 7'. The switching positions can also be used, for example, for coding and/or for address settings, especially when the electric terminal module is configured as a station of a bus system or of a wireless network. Therefore, one wheel with ten switching positions could be used to set an address from zero to nine.

In the simplest case, the adjustable electric component merely provides two switch positions with which the electric terminal module can be switched on and/or off.

It is likewise provided that the switching function as well as the potentiometer function of the adjustable electric component are configured with an appropriate arrangement of printed conductor sections on the sliding track 9 as well as on the edge 17 of the adjusting means 2, as a result of which two adjustable electric components can be simultaneously formed with one single component. In the embodiment as an adjustable electric resistor, the current can be picked up, for example, by a pick-off arranged on the edge 17 of the adjusting means and forwarded via the rivet 6 to the circuit arrangement on the printed circuit board 4.

In the simplest case, the sliding track 9 formed by a resistive material can be used as an additional resistor. Several resistors can be formed if the sliding track is divided into at least two sections.

Figure 6:
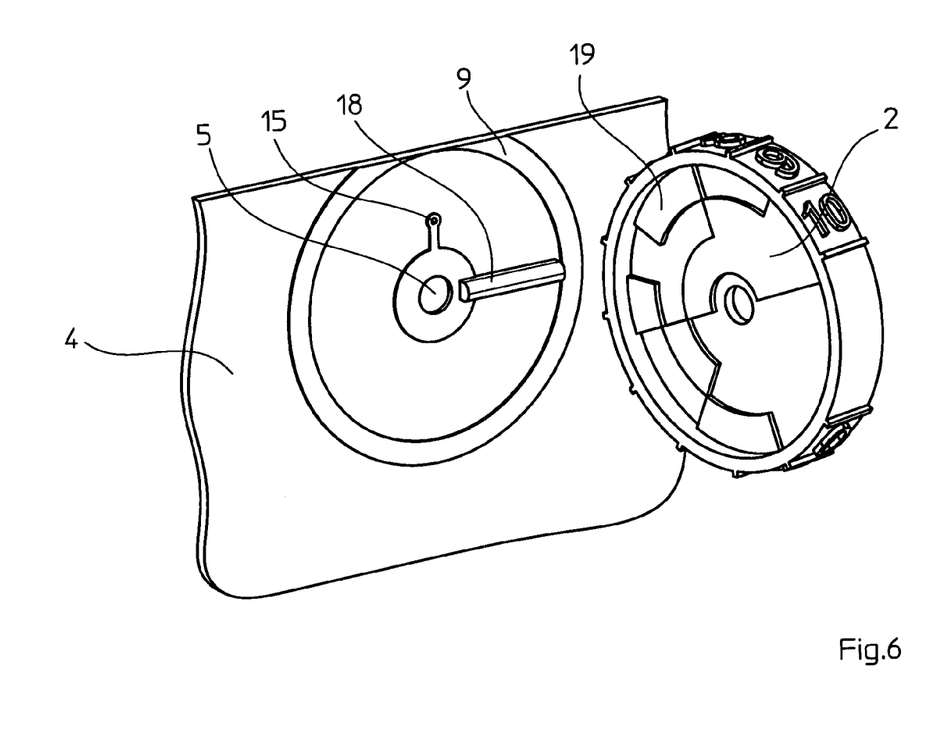
FIG. 6 shows adjustable electronic component with inductive and/or capacitive determination of the position of the adjusting means.

FIG. 6 shows an embodiment of the adjustable electric component in which the position of the adjusting means 2 is determined via an inductive or capacitive sensor 18. For this purpose, an inductive and/or capacitive sensor 18 is arranged on the printed circuit board 4 below the adjusting means 2. On the surface of the adjusting means 2 facing the printed circuit board 4, there are several metalized sections 19. The sensor or an evaluation circuit (not shown here) connected to the sensor evaluates the absolute and/or relative position of the adjusting means 2 on the printed circuit board 4. When the adjusting means 2 is turned, the metalized sections 19 on the adjusting means 2 wipe over the sensor 18, whereby a pulse is generated by the sensor 18. The number of pulses is proportional to the path of the adjusting means 2 traveled during the rotation. The direction of rotation of the adjusting means 2 can also be determined by an appropriate arrangement of the metalized surfaces as known from the state of the art. The sensor itself and/or the evaluation circuit connected to it generates an electric characteristic quantity that is proportional to the adjustment distance and that can be set or changed with the function of the electric terminal module. Through the determination of the direction of rotation, it can be determined whether the value of the set electric characteristic quantity should be decreased or increased.

Of course, an optical detection of the position of the adjusting means 2 and/or a determination of the direction of rotation are also possible by replacing a capacitive and/or inductive sensor 18 below the adjusting means 2 with an optical sensor, and by applying a generally known light/dark pattern, preferably a suitable, likewise familiar line pattern, onto the surface of the adjusting means 2 opposite from the printed circuit board 4.

Figure 7:
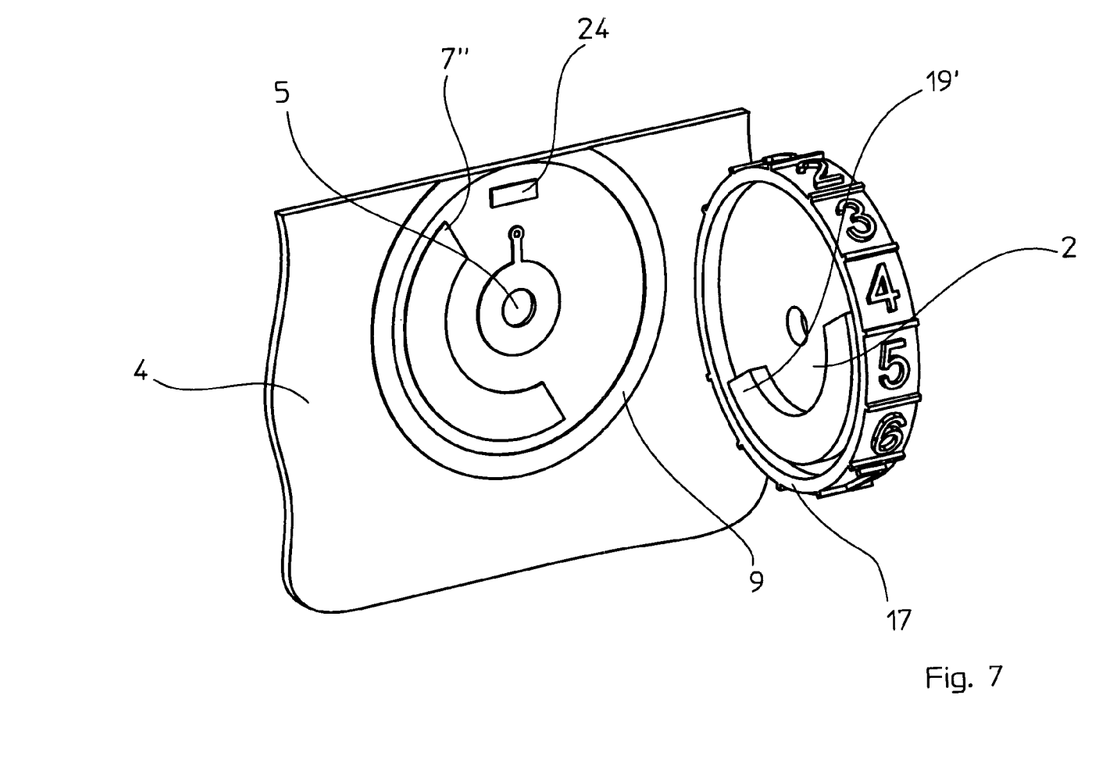
FIG. 7 shows an adjustable electric component configured as a variable capacitor in the state in which it has not yet been arranged on the printed circuit board.

FIG. 7 shows an embodiment of the adjustable electric component within the electric terminal module as an adjustable capacitor. For this purpose, a first printed conductor section 7'' in the form of a metalized surface is arranged on the printed circuit board 4 below the adjusting means 2, and a metalized section 19' is arranged on the surface of the adjusting means 2 opposite from the printed circuit board. Both surfaces are opposite from each other in such a way that they can be made to overlap at least partially when the adjusting means 2 is turned. The more areas of the metalized surface that are opposite from each other, the greater the resultant capacitance of the adjustable electric component. The two printed conductor sections (7'', 19') are respectively connected (not shown here) to first and second connection points on the printed circuit board 4. The second connection point of the metalized printed conductor section 19' on the adjusting means 2 can be connected to the printed circuit board, for example, by means of the rivet 6 via the mount 5. On the basis of the shape of the printed conductor section 7'' and of the shape of the metalized section 19', for example, with a width that increases over the length, it is also easy to establish non-linear settings.

Figure 8:
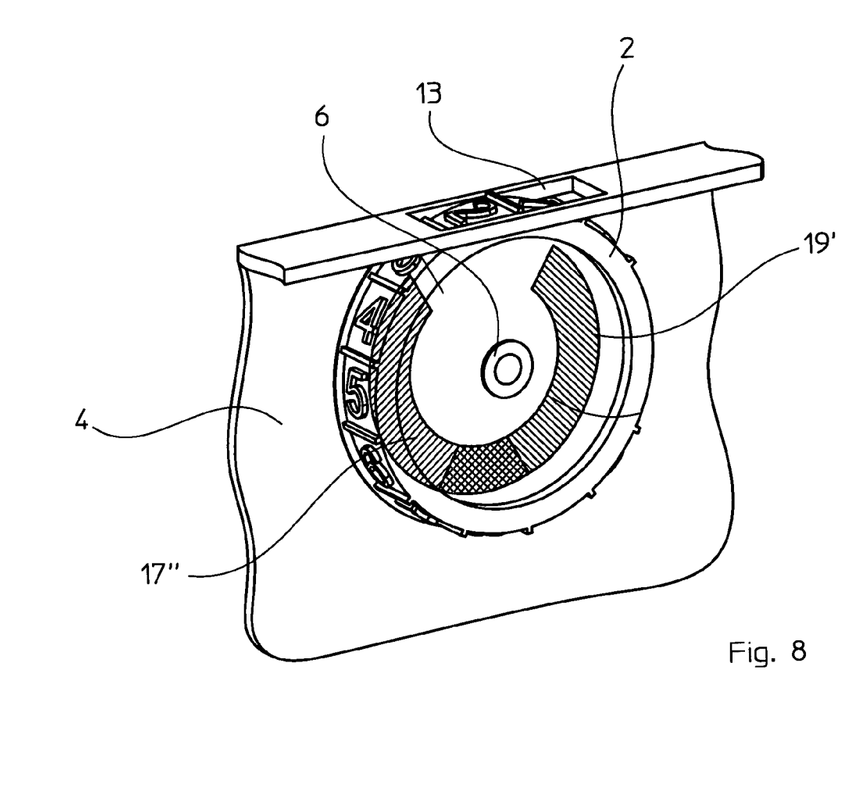
FIG. 8 shows an adjustable electric component configured as a variable capacitor.

FIG. 8 shows the adjustable electric component in the assembled state inside the electric terminal module. The two metalized printed conductor sections (7'', 19') that are at least partially opposite from each other are cross-hatched.

Since the capacitance of the adjustable capacitor depends, among other things, on the width of the air gap between the metalized printed conductor section 19' and the first printed conductor section 7'' on the printed circuit board 4, it can be necessary to dimension the air gap as small as possible in order to achieve a higher capacitance. For this purpose, the adjusting means 2 can be configured in such a way that the metalized printed conductor section 19' located on it can be positioned closer to the surface of the printed circuit board 4. Towards this end, the surfaces of the adjusting means 2 that are opposite from the printed circuit board 4 merely have to be arranged closer to the edge 17.

Furthermore, an additional dielectric layer, for example, in the form of a film, can be arranged in the air gap between the printed conductor section 7" and the metalized printed conductor section 19' in order to increase the capacitance of the adjustable electric component, and this additional dielectric layer can be attached with the rivet 6 between the adjusting means 2 and the printed circuit board 4. If the printed conductor section 7" is in a layer of the printed circuit board itself, the dielectric layer can also be formed by the material of the printed circuit board itself. Both possibilities for increasing the capacitance can also act in combination.

Figure 9:
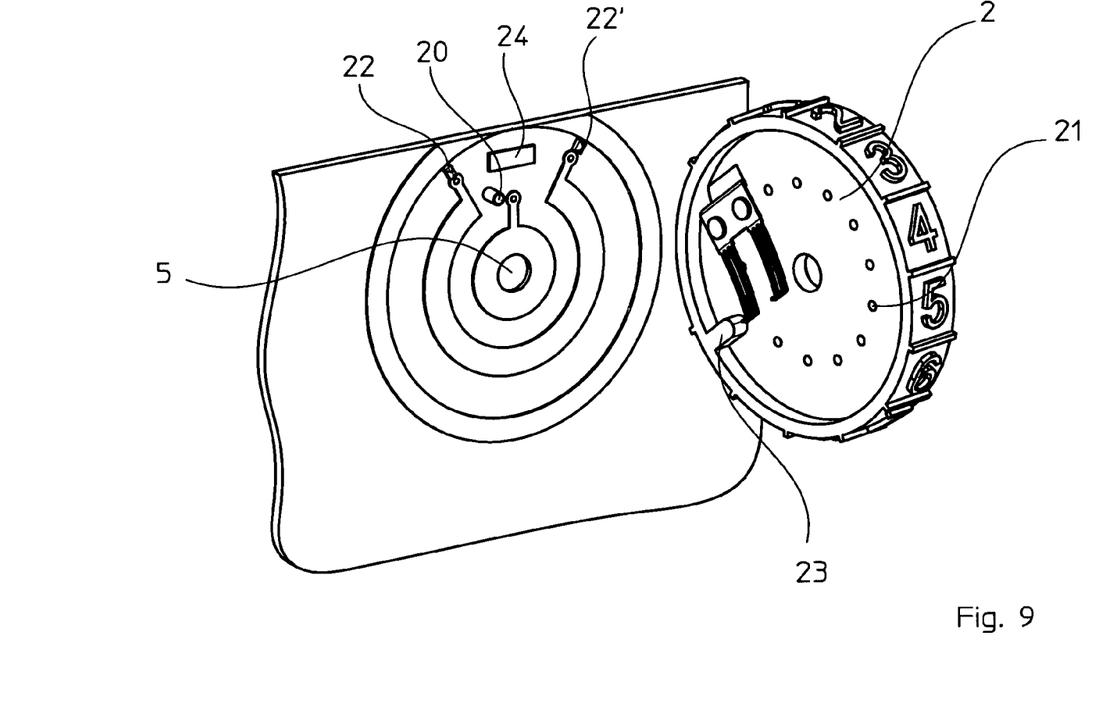
FIG. 9 shows a depiction of a latching device and final stops of the adjustable electric component.

FIG. 9 shows the adjustable electric component in the form of a potentiometer. On the surface of the printed circuit board 4 opposite from the setting device 2, there is a latching element 20, one side of which is firmly connected to the printed circuit board 4. On the other side, there is a preferably resiliently mounted spherical head. Receiving elements are arranged at regular intervals along an orbit on the surface of the adjusting means 2 that is opposite from the conductor surface. The radius of the orbit, measured from the mid-point of the setting element 2, is as big as the distance between the latching element 20 and the mount 5. The receiving elements 21 and the latching element 20 form the latching means. When the setting device 2 turns, the ball of the latching element moves along the orbit and, once it reaches one of the receiving elements 21, it engages into it. In this manner, an operator is informed that a predefined setting position has been reached.

Moreover, stop elements 22, 22' can be arranged on the surface of the printed circuit board 4, and these stop elements interact with counter-stop elements 23 on the surface of the adjusting means 2 that is opposite from the surface of the printed circuit board 4 in such a way that, when the adjusting means 2 is adjusted, a defined initial and/or final position of the adjustable electric component is specified. The initial and/or final position has been reached when the counter-stop element 23 strikes one of the stop elements 22, 22'. Overtwisting of the adjustable electric component can thus be effectively prevented. If no initial and/or final positions are provided, then the electric circuit arrangement on the printed circuit board can monitor whether the adjusting means 2 was turned by the operator into a range in which the elements and counter-elements of the adjustable electronic component can no longer interact as provided. Such a case could occur if, as shown in FIG. 3, the pick-up has been turned between the connection points 14, 15. Exceeding the intended adjustment range can be displayed, for example, by the illuminating means 24 in the form of an error message.

The surface of the adjusting element 2 facing the surface of the printed circuit board can itself accommodate printed conductors and/or electric components that can be applied, for example, by means of MID technology, directly onto the plastic. MID technology is a process with which printed conductors and/or electric components can be arranged directly in or on the plastic of the adjusting means 2, without the use of a printed circuit board. The printed conductors thus applied can be connected to the rivet 6 and/or to the metalized surfaces on the edge 17 of the adjusting element 2. In this manner, it is possible to achieve an even more flexible connection between the counter-elements 7, 8; 18 arranged on the adjusting element 2 with respect to each other and/or with respect to the metalized surfaces applied on the edge 17 of the adjusting means. In this way, the metalized surfaces of the edge 17 of the adjusting means can be interconnected in order to further increase the flexibility of the adjustable electric component.

While the invention has been particularly shown and described with reference to preferred embodiments thereof, it will be understood by those skilled in the art that various changes in form and details may be made therein without departing from the spirit and scope of the invention.

LIST OF REFERENCE NUMERALS

1 housing
2 adjusting means
3 contact element
4 printed circuit board
5 mount
6 rivet
7 first printed conductor
8 second printed conductor (pick-off track)
9 sliding track
10 pick-up
11 marking
12 elevation
13 housing opening
14 first connection point
15 second connection point
16 rim of the adjusting means
17 edge of the adjusting means
18 sensor (capacitive/inductive)
19 metalized section
20 latching element
21 receiving element
22 stop element
23 counter-stop element
24 illuminating means

What is claimed is:

1. An electric terminal module comprising:
   a plurality of electric contact elements configured to connect to electric conductors;
   a housing including an opening in at least one side wall thereof;
   a printed circuit board disposed in the housing, the printed circuit board including a mount, a circuit arrangement having a plurality of electric components configured to perform a specific function, and a sliding track disposed on a surface of the printed circuit board; and
   an adjusting device including a rim, the adjustable device operable to change at least one electric characteristic quantity of the circuit arrangement, where the adjusting device is disposed directly on the printed circuit board via the mount and is operable from outside the housing through the opening so as to swivel or turn,
   wherein the sliding track slideably supports the rim of the adjusting device on the printed circuit board during the swiveling or turning of the adjusting device so as to dissipate forces to the printed circuit board.

2. The electric terminal module recited in claim 1, wherein the adjusting device is attached to the mount on the printed circuit board by at least one of riveting and latching.

3. The electric terminal module recited in claim 1, wherein the adjusting device is held on the mount by a housing part formed on an inside of the housing opposite a side of the adjusting device.

4. The electric terminal module recited in claim 1, wherein a sliding track has a geometry at least partially corresponding with a geometry of the adjusting device.

5. The electric terminal module recited in claim 1, wherein the adjusting device includes a surface facing the printed circuit board including first elements disposed on the surface, and wherein the printed circuit board includes counter-elements configured to interact with the first elements so as to form the electric characteristic quantity when a voltage is applied between the first elements and the counter elements.

6. The electric terminal recited in claim 5, wherein the characteristic quantity is at least one of a resistance, capacitance and an inductance.

7. The electric terminal recited in claim 5, wherein the first elements and counter-elements are configured to provide various current paths in accordance with operation of the adjusting device.

8. The electric terminal recited in claim 5, wherein the first elements and counter elements are configured to provide at least one of optical, capacitive and inductive detection of at least one of a relative and absolute position of the adjusting device with respect to the printed circuit board.

9. The electric terminal recited in claim 1, wherein each of an edge of the adjusting device facing the printed circuit board and an area of the circuit board opposite the edge include additional elements configured to interact so as to provide a second electric characteristic quantity when a voltage is applied between the respective additional elements.

10. The electric terminal recited in claim 1, wherein the adjusting device includes latching mechanisms disposed at predetermined intervals on or in the printed circuit board.

11. The electric terminal recited in claim 1, wherein the adjusting device includes at least one of a transparent and a translucent material, and wherein the printed circuit board includes a light source configured to illuminate the adjusting device.

12. The electric terminal recited in claim 1, wherein the adjusting device includes a wheel with an outer circumference, the outer circumference including markings configured for setting the electric characteristic quantity in prescribed increments.

13. The electric terminal recited in claim 12, further comprising at least one of notch-shaped recesses and elevations disposed between the markings.

14. The electric terminal recited in claim 12, wherein the markings are configured to have a logical relationship with an electric characteristic quantity that is set using the adjusting device.

15. The electric terminal recited in claim 1, wherein the printed circuit board includes stops defining at least one of a starting and an ending position of the adjusting device.

16. The electric terminal recited in claim 5, wherein an edge of the adjusting device surrounds the first elements and the counter elements.

17. The electric terminal recited in claim 1, wherein an overall width of the housing is no more than eight millimeters or one and a half times a height of the adjusting device.

18. The electric terminal recited in claim 1, further comprising another adjusting device disposed on a side of the printed circuit hoard opposite the adjusting device.

* * * * *